United States Patent
Hamanaka et al.

(10) Patent No.: US 9,672,963 B2
(45) Date of Patent: Jun. 6, 2017

(54) CERAMIC ELECTRONIC COMPONENT AND METHOD OF MANUFACTURING THE SAME

(71) Applicant: Murata Manufacturing Co., Ltd., Nagaokakyo-shi, Kyoto-fu (JP)

(72) Inventors: Kenichi Hamanaka, Nagaokakyo (JP); Kota Zenzai, Nagaokakyo (JP); Taku Dekura, Nagaokakyo (JP); Kiyotaka Maegawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 355 days.

(21) Appl. No.: 14/305,103

(22) Filed: Jun. 16, 2014

(65) Prior Publication Data

US 2014/0375173 A1    Dec. 25, 2014

(30) Foreign Application Priority Data

Jun. 19, 2013  (JP) ................................ 2013-128282
Apr. 23, 2014  (JP) ................................ 2014-089244

(51) Int. Cl.
*H01L 41/047*  (2006.01)
*H01L 41/083*  (2006.01)
(Continued)

(52) U.S. Cl.
CPC ............ *H01C 7/008* (2013.01); *H01C 1/148* (2013.01); *H01C 7/18* (2013.01); *H01F 27/292* (2013.01);
(Continued)

(58) Field of Classification Search
CPC ........ H01G 4/30; H01G 4/2325; H01G 4/228; H01L 41/047; H01L 41/083; H03H 9/131
(Continued)

(56) References Cited

U.S. PATENT DOCUMENTS 7,847,371 B2 * 12/2010 Komatsu ............. H01G 4/2325
                                                    174/258
2006/0044098 A1    3/2006 Kimura et al.
(Continued)

FOREIGN PATENT DOCUMENTS

| JP | 2009-200421 A | 9/2009 | |
|---|---|---|---|
| JP | 2013-118356 A | 6/2013 | |
| JP | 2013-118357 A | 6/2013 | |
| JP | 2013-118358 A | * 6/2013 | ............... H01G 4/12 |
| JP | 2013-118358 A | 6/2013 | |
| WO | 2004/053901 A1 | 6/2004 | |

OTHER PUBLICATIONS

Official Communication issued in corresponding Japanese Patent Application No. 2014-089244, mailed on Aug. 9, 2016.

*Primary Examiner* — Thomas Dougherty
(74) *Attorney, Agent, or Firm* — Keating & Bennett, LLP (57) ABSTRACT

A ceramic electronic component includes a rectangular or substantially rectangular parallelepiped shaped laminate in which a ceramic layer and an internal electrode are alternately laminated and an external electrode provided on a portion of a surface of the laminate and electrically connected to the internal electrode. The external electrode includes an inner external electrode covering a portion of the surface of the laminate and including a mixture of a resin component and a metal component and an outer external electrode covering the inner external electrode and including a metal component. The inner external electrode includes, as a metal component, a first metal component of which a portion forms an alloy with the internal electrode so as to connect the internal electrode and the inner external electrode to each other, and a second metal component higher in melting point than the first metal component, of which a portion forms an alloy with the first metal component so as to connect the inner external electrode and the outer external electrode to each other. A concentration of a metal in a surface layer of the inner external electrode is not lower than about 17%.

8 Claims, 6 Drawing Sheets

(51) Int. Cl.
*H01C 7/00* (2006.01)
*H01G 4/30* (2006.01)
*H01F 27/29* (2006.01)
*H01L 41/293* (2013.01)
*H01C 1/148* (2006.01)
*H01C 7/18* (2006.01)
*H01G 4/232* (2006.01)
*H01G 4/12* (2006.01)
*H01F 17/00* (2006.01)
*H01F 41/04* (2006.01)

(52) U.S. Cl.
CPC ........... *H01G 4/232* (2013.01); *H01G 4/2325* (2013.01); *H01G 4/30* (2013.01); *H01L 41/0472* (2013.01); *H01L 41/0477* (2013.01); *H01L 41/293* (2013.01); *H01F 17/0013* (2013.01); *H01F 41/046* (2013.01); *H01G 4/12* (2013.01); *Y10T 29/42* (2015.01); *Y10T 29/43* (2015.01); *Y10T 29/4902* (2015.01); *Y10T 29/49085* (2015.01)

(58) Field of Classification Search
USPC .......... 310/363–366; 361/301.4, 305, 306.1, 361/306.3, 307, 308.1, 321.2
See application file for complete search history.

(56) References Cited

U.S. PATENT DOCUMENTS

| | | | |
|---|---|---|---|
| 2012/0236462 A1* | 9/2012 | Haruki | H01G 4/005 361/306.1 |
| 2013/0106560 A1 | 5/2013 | Zenzai et al. | |
| 2013/0107420 A1 | 5/2013 | Sakurada et al. | |
| 2013/0107421 A1* | 5/2013 | Zenzai | H01G 4/12 361/321.1 |
| 2013/0250472 A1* | 9/2013 | Lee | H01G 4/12 361/301.4 |
| 2013/0329336 A1* | 12/2013 | Cho | H01G 4/008 361/301.4 |
| 2014/0375173 A1* | 12/2014 | Hamanaka | H01L 41/0472 310/363 |
| 2014/0376155 A1* | 12/2014 | Omori | H01G 4/232 361/301.4 |
| 2015/0170786 A1* | 6/2015 | Hong | H01B 1/02 174/260 |
| 2015/0223334 A1* | 8/2015 | Nakagawa | H05K 3/3442 174/258 |
| 2015/0279566 A1* | 10/2015 | Otani | H01G 4/30 361/301.4 |

* cited by examiner

CERAMIC ELECTRONIC COMPONENT AND METHOD OF MANUFACTURING THE SAME

BACKGROUND OF THE INVENTION

Field of the Invention

The present invention relates to a ceramic electronic component and a method of manufacturing the same.

Description of the Related Art

Ceramic electronic components including laminated ceramic capacitors have recently been used in an environment that is more severe than in a conventional example.

For example, electronic components included in mobile devices such as a portable telephone and a portable music player are required to be resistant to shock at a time of being dropped. Specifically, electronic components are required not to be detached from a mounting board and to be free from cracks when a drop impact is applied thereto.

Electronic components included in car-mounted devices such as an ECU (Engine Control Unit) are required to be resistant to shock originating from a heat cycle. Specifically, electronic components are required to be free from cracks in solder used for mounting and in the electronic components themselves when bending stress resulting from thermal expansion and contraction of a mounting board originating from a heat cycle is applied thereto.

In order to satisfy the requirements above, use of a thermosetting conductive paste for an external electrode of a ceramic electronic component, instead of a conventional firing-type conductive paste, has been proposed.

WO2004/053901 discloses a laminated ceramic electronic component having an external electrode formed of a thermosetting conductive paste.

In the laminated ceramic electronic component described in WO2004/053901, an external electrode is formed through plating of an external electrode layer formed of a thermosetting conductive paste containing a resin and metal powders having a melting point not higher than 300° C.

In general, a resin is high in hygroscopicity and tends to absorb moisture. As a resin which has absorbed moisture is heated, moisture is vaporized and water vapor is generated in the resin, and in addition, some of the resin is decomposed to generate a decomposition gas.

When an external electrode is formed through plating of an external electrode layer formed of a thermosetting conductive paste containing a resin as in the laminated ceramic electronic component described in WO2004/053901, heating in a reflow step in mounting the laminated ceramic electronic component leads to generation of water vapor and a decomposition gas in the external electrode. The water vapor and the decomposition gas are confined by a plating film on a surface of the external electrode.

When a defective portion or a partially thin portion is present in a plating film, the confined water vapor and decomposition gas may burst from the defective portion or the thin portion to the outside of the external electrode. This burst causes such a phenomenon that solder molten in the reflow step is blown off, which is generally called "solder burst".

When a thermosetting conductive paste is directly applied to a ceramic laminate as in the laminated ceramic electronic component described in WO2004/053901, moisture contained in the ceramic laminate is absorbed in the resin in the external electrode. Then, an amount of water vapor generated during heating increases, and solder burst is more likely.

SUMMARY OF THE INVENTION

Preferred embodiments of the present invention provide a ceramic electronic component and a method of manufacturing the same, which significantly reduce or prevent the occurrence of solder burst.

A ceramic electronic component according to a preferred embodiment of the present invention includes a rectangular or substantially rectangular parallelepiped laminate in which a ceramic layer and an internal electrode are alternately laminated and an external electrode provided on a portion of a surface of the laminate and electrically connected to the internal electrode. The external electrode includes an inner external electrode covering a portion of the surface of the laminate and including a mixture of a resin component and a metal component and an outer external electrode covering the inner external electrode and including a metal component. The inner external electrode includes, as a metal component, a first metal component of which a portion forms an alloy with the internal electrode so as to connect the internal electrode and the inner external electrode to each other and a second metal component higher in melting point than the first metal component, of which a portion forms an alloy with the first metal component so as to connect the inner external electrode and the outer external electrode to each other. A concentration of a metal in a surface layer of the inner external electrode preferably is not lower than about 17%, for example.

A method of manufacturing a ceramic electronic component according to another preferred embodiment of the present invention includes the steps of preparing a rectangular or substantially rectangular parallelepiped laminate in which a ceramic layer and an internal electrode are alternately laminated and providing an external electrode on a portion of a surface of the laminate so as to be electrically connected to the internal electrode. The step of providing an external electrode includes the steps of providing an inner external electrode by applying a mixture of a resin component and a metal component so as to cover a portion of the surface of the laminate and heating the laminate onto which the mixture has been applied, barrel-polishing a surface layer of the inner external electrode, and providing an outer external electrode by plating the inner external electrode subjected to the step of barrel-polishing with a metal component so as to cover the inner external electrode. The metal component of the inner external electrode includes a first metal component of which a portion forms an alloy with the internal electrode so as to connect the internal electrode and the inner external electrode to each other and a second metal component higher in melting point than the first metal component, of which a portion forms an alloy with the first metal component so as to connect the inner external electrode and the outer external electrode to each other. After the step of barrel-polishing, a concentration of a metal in a surface layer of the inner external electrode preferably is not lower than about 17%, for example.

In a preferred embodiment of the present invention, the metal component of the outer external electrode is Ni.

In a preferred embodiment of the present invention, the first metal component is Sn.

In a preferred embodiment of the present invention, the second metal component is Ag or Cu.

In a preferred embodiment of the present invention, a content of the first metal component in the mixture is not lower than about 20 weight % and not higher than about 40 weight %, for example.

In a preferred embodiment of the present invention, a content of the second metal component in the mixture is not lower than about 30 weight % and not higher than about 70 weight %, for example.

In a preferred embodiment of the present invention, a temperature for heating the laminate in the step of providing an inner external electrode is not lower than about 450° C., for example.

In a preferred embodiment of the present invention, in the step of providing an inner external electrode, the laminate is heated in an atmosphere in which a concentration of oxygen is not higher than about 100 ppm, for example.

According to various preferred embodiments of the present invention, the occurrence of solder burst is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A ceramic electronic component according to preferred embodiments of the present invention will be described hereinafter with reference to the drawings. In the description of the preferred embodiments below, the same or corresponding elements in the drawings have the same reference numerals allotted and description thereof will not be repeated. Though a ceramic capacitor will be described as a ceramic electronic component in the description below, the electronic component is not limited to a capacitor, and the electronic component includes a piezoelectric component, a thermistor, or an inductor.

Figure 1:
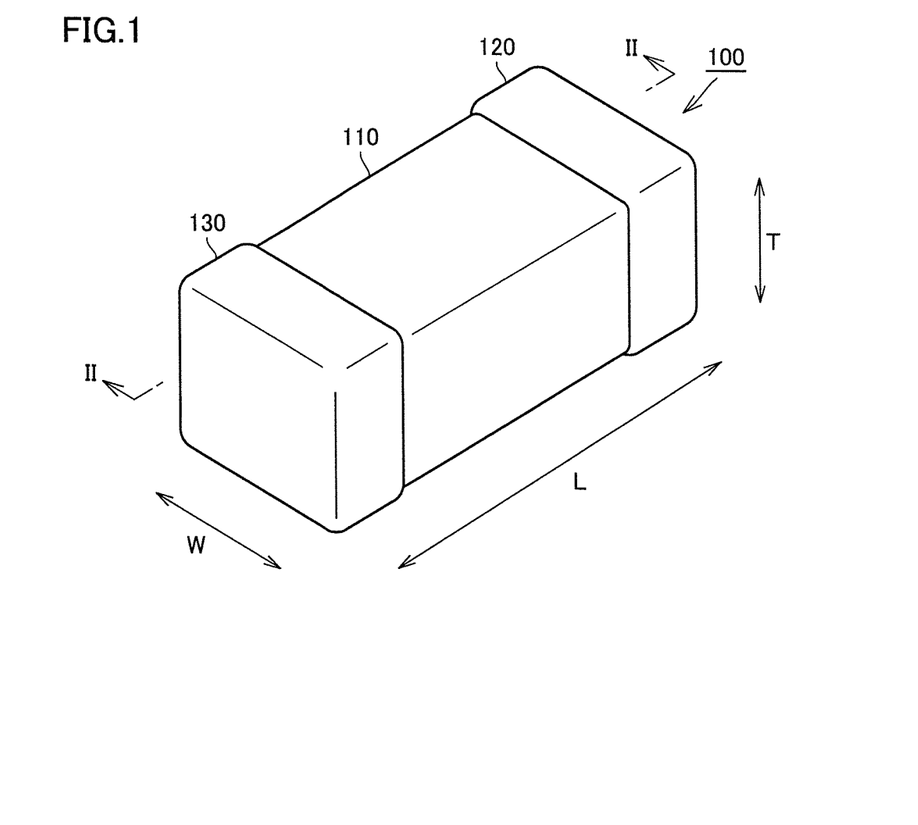
FIG. 1 is a perspective view showing an appearance of a ceramic electronic component according to a preferred embodiment of the present invention.
Figure 2:
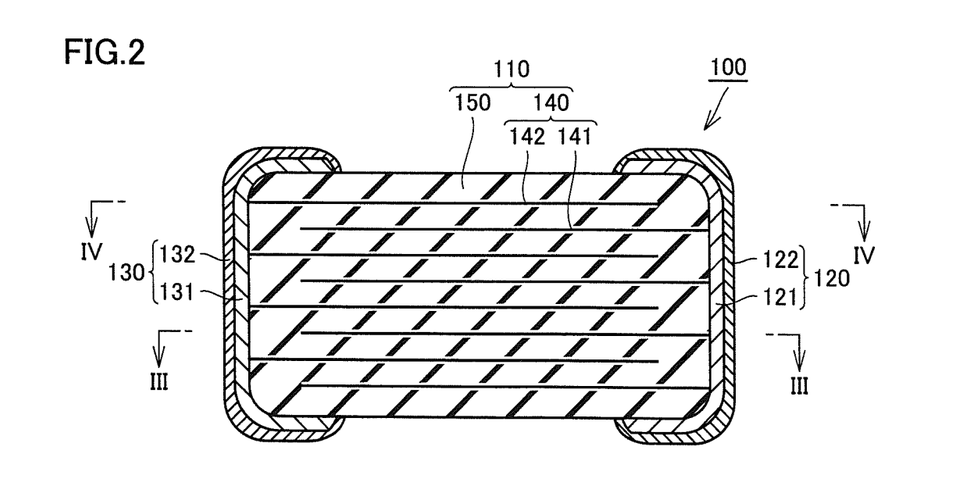
FIG. 2 is a cross-sectional view of the ceramic electronic component in FIG. 1 viewed in a direction shown with an arrow along the line II-II.
Figure 3:
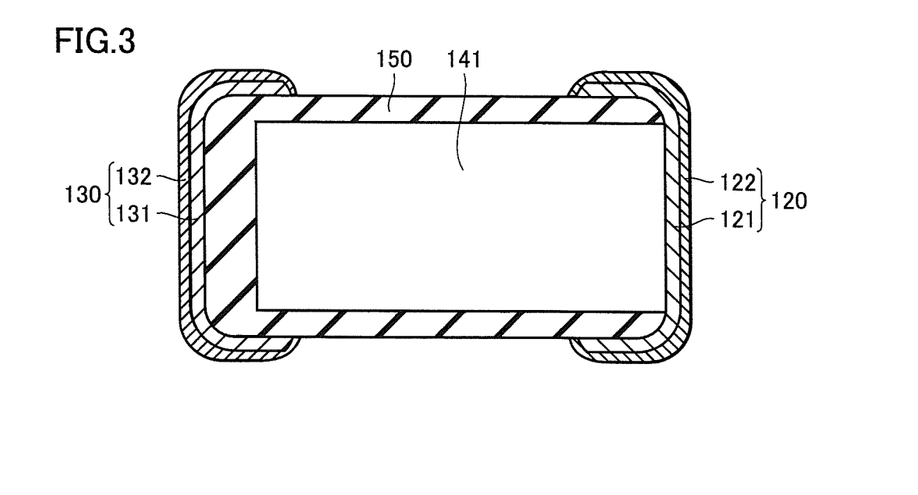
FIG. 3 is a cross-sectional view of the ceramic electronic component in FIG. 2 viewed in a direction shown with an arrow along the line III-III.
Figure 4:
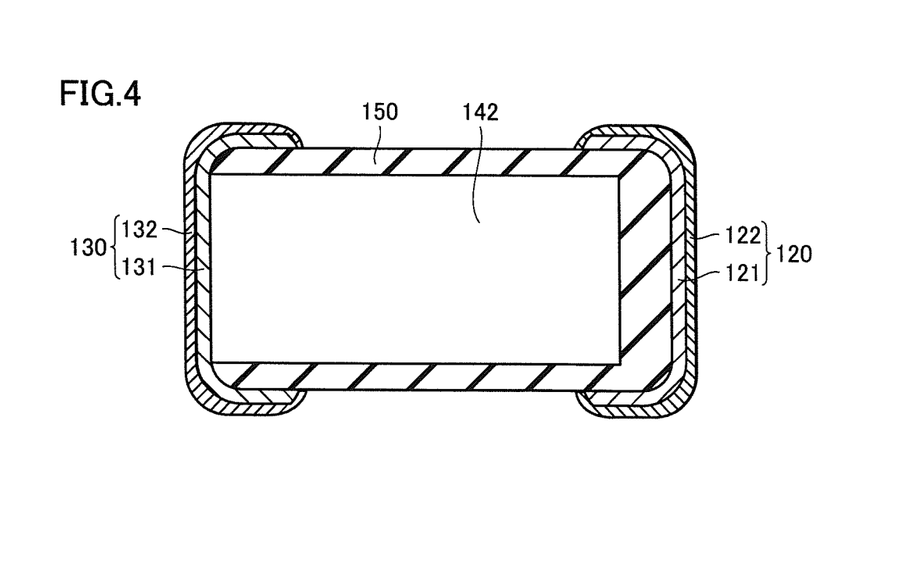
FIG. 4 is a cross-sectional view of the ceramic electronic component in FIG. 2 viewed in a direction shown with an arrow along the line IV-IV.

FIG. 1 is a perspective view showing an appearance of a ceramic electronic component according to a preferred embodiment of the present invention. FIG. 2 is a cross-sectional view of the ceramic electronic component in FIG. 1 viewed in a direction shown with an arrow along the line II-II. FIG. 3 is a cross-sectional view of the ceramic electronic component in FIG. 2 viewed in a direction shown with an arrow along the line III-III. FIG. 4 is a cross-sectional view of the ceramic electronic component in FIG. 2 viewed in a direction shown with an arrow along the line IV-IV. FIG. 1 shows a longitudinal direction L of a laminate which will be described later, a width direction W of the laminate, and a thickness direction T of the laminate.

As shown in FIGS. 1 to 4, a ceramic electronic component 100 according to a preferred embodiment of the present invention includes a rectangular or substantially rectangular parallelepiped laminate 110 in which a ceramic layer 150 and a flat plate-shaped internal electrode 140 are alternately laminated and an external electrode provided on a portion of a surface of laminate 110 and electrically connected to internal electrode 140.

In the present preferred embodiment, the external electrode is provided in each of opposing end portions of laminate 110. Specifically, the external electrode includes a first external electrode 120 provided in one end portion in a longitudinal direction of laminate 110 and a second external electrode 130 provided in the other end portion in the longitudinal direction of laminate 110.

Of internal electrodes 140 opposed adjacently to each other, a first internal electrode 141 is electrically connected to first external electrode 120, and a second internal electrode 142 is electrically connected to second external electrode 130.

In laminate 110 according to the present preferred embodiment, a direction of laminate of ceramic layer 150 and internal electrode 140 is perpendicular or substantially perpendicular to longitudinal direction L of laminate 110 and width direction W of laminate 110. Namely, a direction of laminate of ceramic layer 150 and internal electrode 140 is in parallel or substantially parallel to thickness direction T of laminate 110.

Laminate 110 includes a pair of main surfaces perpendicular or substantially perpendicular to thickness direction T, a pair of end surfaces perpendicular or substantially perpendicular to longitudinal direction L, and a pair of side surfaces perpendicular or substantially perpendicular to width direction W.

As described above, though laminate 110 preferably has a rectangular or substantially rectangular parallelepiped shape, it may be rounded in a corner portion. Any surface of the pair of main surfaces, the pair of side surfaces, and the pair of side surfaces may include projections and recesses.

Each ceramic layer 150 has a thickness preferably not smaller than about 0.5 μm and not greater than about 10 μm, for example. As a material for forming ceramic layer 150, dielectric ceramics mainly including $BaTiO_3$, $CaTiO_3$, $SrTiO_3$, or $CaZrO_3$ can be used. A material in which a Mn compound, a Fe compound, a Cr compound, a Co compound, or a Ni compound is added as a sub component to such a main component may be used.

In a case that an electronic component is a piezoelectric component, laminate 110 can be formed of piezoelectric ceramics. For example, PZT (lead zirconate titanate)-based ceramics is available as piezoelectric ceramics.

In a case that an electronic component is a thermistor, laminate 110 can be formed of semiconductor ceramics. For example, spinel-type ceramics is available as semiconductor ceramics.

In a case that an electronic component is an inductor, laminate 110 can be formed of magnetic ceramics. For example, ferrite ceramics is available as magnetic ceramics.

Each internal electrode 140 has a thickness preferably not smaller than about 0.2 μm and not greater than about 2.0 μm, for example. Internal electrode 140 includes first internal electrode 141 having a rectangular or substantially rectangular shape in a two-dimensional view and second internal electrode 142 having a rectangular or substantially rectangular shape in a two-dimensional view. First internal electrode 141 and second internal electrode 142 are alternately arranged at regular intervals along thickness direction T of laminate 110. First internal electrode 141 and second internal electrode 142 are arranged to be opposed to each other, with ceramic layer 150 lying therebetween.

First internal electrode 141 extends from one end portion in the longitudinal direction of laminate 110 toward the other end portion. As shown in FIG. 3, first internal electrode 141 is connected to first external electrode 120 in one end surface of laminate 110.

Second internal electrode 142 extends from the other end portion in the longitudinal direction of laminate 110 toward one end portion. As shown in FIG. 4, second internal electrode 142 is connected to second external electrode 130 in the other end surface of laminate 110.

As a material for forming internal electrode 140, a metal such as Ni, Cu, Ag, Pd, or Au or an alloy containing at least one of these metals such as an alloy of Ag and Pd may preferably be used. A material forming internal electrode 140 forms an alloy as a result of chemical combination with a first metal component contained in a mixture forming an inner external electrode which will be described later.

The external electrode includes an inner external electrode covering each of opposing end portions of laminate 110 and including a mixture of a resin component and a metal component and an outer external electrode covering the inner external electrode and including a metal component. As a resin component, a thermosetting resin such as an epoxy resin or a phenol resin can be used. A thickness of the inner external electrode is preferably not smaller than about 5.0 μm and not greater than about 70.0 μm, for example.

As shown in FIGS. 2 to 4, first external electrode 120 includes a first inner external electrode 121 and a first outer external electrode 122. First inner external electrode 121 covers one end portion in the longitudinal direction of laminate 110. A portion of first inner external electrode 121 forms an alloy together with a portion of first internal electrode 141.

Second external electrode 130 includes a second inner external electrode 131 and a second outer external electrode 132. Second inner external electrode 131 covers the other end portion in the longitudinal direction of laminate 110. A portion of second inner external electrode 131 forms an alloy together with a portion of second internal electrode 142.

In the present preferred embodiment, the inner external electrode includes, as a metal component, a first metal component and a second metal component higher in melting point than the first metal component. A melting point of the first metal component is preferably not higher than about 550° C. and further preferably not lower than about 180° C. and even more preferably not higher than about 340° C., for example. A melting point of the second metal component is preferably not lower than about 850° C. and not higher than about 1050° C., for example.

As the first metal component, a metal such as Sn, In, or Bi or an alloy containing at least one of these metals is preferably used. As the first metal component, an alloy containing Sn such as an alloy of Sn and Ag, an alloy of Sn and Bi, or an alloy of Sn, Ag, and Cu, or Sn is preferably used. By using such a metal component, an alloy layer of internal electrode 140 and the inner external electrode are easily formed, and hence electrical connection between internal electrode 140 and the inner external electrode is easily established.

The first metal component is softened and fluidized through heating in a reflow step in mounting ceramic electronic component 100, and chemically combined with a material forming internal electrode 140 to thus form an alloy.

A content of the first metal component in a heated and cured mixture is preferably not lower than about 8 volume % and not higher than about 18 volume %, for example.

As the second metal component, a metal such as Ag, Cu, Pd, Pt, or Au or an alloy containing at least one of these metals is preferably used. As the second metal component, an alloy containing Ag such as an alloy of Ag and Pd, or Ag, or Cu is preferably used.

The second metal component defines a conduction path within the inner external electrode. The second metal component forms an alloy as a result of chemical combination with the first metal component. A content of the second metal component in a heated and cured mixture is preferably not lower than about 19 volume % and not higher than about 25 volume %, for example.

First outer external electrode 122 covers first inner external electrode 121. A portion of first outer external electrode 122 forms an alloy together with a portion of first inner external electrode 121. Second outer external electrode 132 covers second inner external electrode 131. A portion of second outer external electrode 132 forms an alloy together with a portion of second inner external electrode 131.

In the present preferred embodiment, a metal component of the outer external electrode is Ni. A metal component of the outer external electrode is not limited to Ni, and it may be Cu. The outer external electrode functions as a solder barrier layer. A thickness of the outer external electrode is preferably not smaller than about 1.0 μm and not greater than about 15.0 μm, for example.

In the present preferred embodiment, the external electrode further includes a not-shown surface external electrode covering the outer external electrode. As a material for forming the surface external electrode, a metal such as Sn or Au having good solder wettability or an alloy containing at least one of these metals is preferably used. A thickness of the surface external electrode is preferably not smaller than about 1.0 μm and not greater than about 15.0 μm, for example.

In ceramic electronic component 100 according to the present preferred embodiment having the features above, a concentration of a metal in a surface layer of the inner external electrode located at a boundary between the inner external electrode and the outer external electrode preferably is not lower than about 17%, for example.

Here, a concentration of a metal in a surface layer of the inner external electrode refers to a ratio of a total of atomic percentage of the first metal component and atomic percentage of the second metal component to a total of atomic percentage of the first metal component, atomic percentage of the second metal component, and atomic percentage of the resin component in a surface layer extending from the outer surface of the inner external electrode to a prescribed depth therein. Atomic percentage of the resin component is defined as atomic percentage of C contained in the resin component. A prescribed depth refers to a depth in a range affecting crystal growth of the outer external electrode, and for example, to a depth of about 5 nm, for example, from the outer surface of the inner external electrode.

By setting a concentration of a metal in a surface layer of the inner external electrode to about 17% or higher, in forming the outer external electrode on the inner external electrode, a point of growth of a metal component of the outer external electrode is sufficiently ensured. Consequently, in ceramic electronic component 100 according to the present preferred embodiment, the outer external electrode having substantially no defective portion is formed substantially uniformly on the inner external electrode.

By thus covering the inner external electrode substantially uniformly with the outer external electrode having substantially no defective portion, most of water vapor generated as a result of vaporization of moisture and a decomposition gas generated as a result of decomposition of the resin component in the inner external electrode due to heating in a reflow step in mounting ceramic electronic component 100 is confined in the external electrode by the outer external electrode. Solder burst is thus significantly reduced or prevented.

As the inner external electrode includes a resin component, it functions as a buffer layer. Namely, when a physical shock or a shock originating from a heat cycle is applied to ceramic electronic component 100, the resin component in the inner external electrode absorbs the shock. Consequently, occurrence of a crack in solder used for mounting and in ceramic electronic component 100 itself is significantly reduced or prevented.

In a case that an amount of the resin component in the inner external electrode is large, an amount of moisture absorbed in the resin component is large and solder burst is likely, which is not desirable. Therefore, an amount of the resin component in the inner external electrode should preferably be small within such a range that the inner external electrode functions as a buffer layer.

From this point of view, in a case that ceramic electronic component 100 has an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, a volume occupied by the resin component in the inner external electrode is preferably not higher than about $3.3 \times 10^{-6}$ ml, for example.

Here, a method of calculating a volume of a resin component in an inner external electrode will be described. Initially, a weight of laminate 110 is measured. Then, an amount of increase from the weight of laminate 110 is calculated by measuring a weight of the laminate after a mixture paste was applied. This amount of increase is the weight of the applied, uncured mixture paste. A weight of a resin contained in the uncured mixture paste is calculated by multiplying the weight of this uncured mixture paste by a weight ratio (a content) of the resin in the uncured mixture paste.

A thermogravimetric/differential thermal analyzer (TG-DTA) is used to measure in advance a weight of the uncured resin component and a weight of the cured resin component with a temperature condition being varied. As a result of this measurement, tendency of transition of a weight of the resin component in heating at a firing temperature is determined. Specifically, a rate of decrease in weight of the resin component in heating at a firing temperature is determined. Instead of the thermogravimetric/differential thermal analyzer (TG-DTA), a thermogravimetry mass spectrometer (TG-MS) may be used to measure a weight of the uncured resin component and a weight of the cured resin component with a temperature condition being varied.

An amount of decrease of the cured resin is calculated by multiplying a rate of decrease in weight of the resin component determined in advance by a weight of the uncured resin. Therefore, a weight of a resin contained in the cured mixture paste, that is, in the inner external electrode, is calculated by subtracting an amount of decrease in cured resin from the weight of the resin contained in the uncured mixture paste. A volume of the resin contained in the inner external electrode is calculated by dividing the weight of the cured resin by density of the cured resin.

Figure 5:
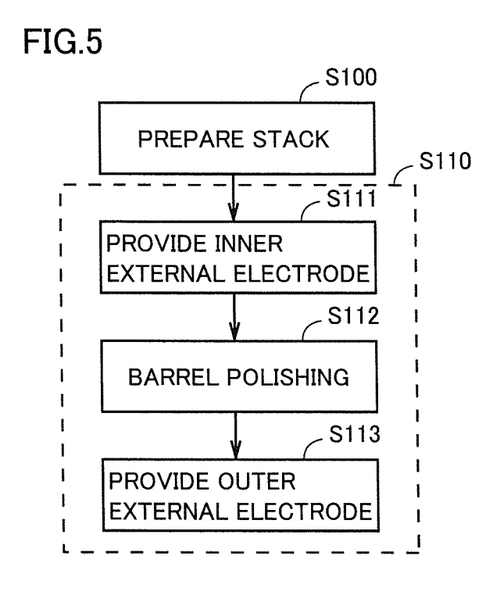
FIG. 5 is a flowchart showing a method of manufacturing a ceramic electronic component according to a preferred embodiment of the present invention.

A non-limiting example of a method of manufacturing a ceramic electronic component according to a preferred embodiment of the present invention will be described below with reference to the drawings. FIG. 5 is a flowchart showing a method of manufacturing a ceramic electronic component according to a preferred embodiment of the present invention.

As shown in FIG. 5, rectangular or substantially rectangular parallelepiped laminate 110 in which ceramic layer 150 and internal electrode 140 are alternately laminated is prepared (S100). Laminate 110 is fabricated as below.

Initially, a ceramic green sheet is fabricated by applying a ceramic paste containing ceramic powders into a sheet with screen printing and drying the paste.

In some of a plurality of fabricated ceramic green sheets, a conductive paste for forming an internal electrode is applied onto the ceramic green sheet in a prescribed pattern with screen printing. Thus, a ceramic green sheet having a conductive pattern to be an internal electrode formed and a ceramic green sheet not having a conductive pattern formed are prepared. The ceramic paste and the conductive paste for forming an internal electrode may contain a binder and a solvent which are known.

A mother laminate is fabricated by laminating a prescribed number of ceramic green sheets not having a conductive pattern formed thereon, successively laminating thereon a plurality of ceramic green sheets having a conductive pattern formed thereon, and laminating further thereon a prescribed number of ceramic green sheets not having a conductive pattern formed thereon. A mother laminate may be pressed in a direction of laminate by isostatic pressing as necessary, for example.

By cutting and dividing the mother laminate in a prescribed shape, a plurality of rectangular or substantially rectangular parallelepiped soft laminates are fabricated. A rectangular or substantially rectangular parallelepiped soft laminate may be subjected to barrel polishing so as to round a corner portion of the soft laminate.

Laminate 110 is fabricated by curing the soft laminate by firing the same. A firing temperature is set as appropriate depending on a type of a ceramic material and a conductive material, and for example, a temperature is set within a range not lower than about 900° C. and not higher than about 1300° C., for example.

Then, a mixture paste which is a mixture containing a resin component such as a thermosetting resin, a first metal filler including a first metal component, and a second metal filler including a second metal component higher in melting point than the first metal component is prepared. A weight ratio (a content) of the first metal filler to a total weight of the first metal filler, the second metal filler, and the resin component in the mixture paste is preferably not lower than about 20 weight % and not higher than about 40 weight % and more preferably not lower than about 22.0 weight % and not higher than about 37.2 weight %, for example.

In a case that a content of the first metal filler is too low, an amount of an alloy formed as a result of chemical combination with a material forming internal electrode 140 is insufficient, and electrical connection between internal electrode 140 and the external electrode cannot be ensured.

In a case that a content of the first metal filler is too high, an amount of the first metal filler which does not react with the second metal filler but remains increases. In this case, the external electrode may deform due to heating in a reflow step in mounting ceramic electronic component 100. A shape of the first metal filler is not particularly limited, and it may be spherical or flat, for example.

A weight ratio (a content) of the second metal filler to a total weight of the first metal filler, the second metal filler, and the resin component in the mixture paste is preferably not lower than about 30 weight % and not higher than about 70 weight % and more preferably not lower than about 41.2 weight % and not higher than about 64 weight %, for example.

In a case that a content of the second metal filler is too low, conductivity of the external electrode is lowered and equivalent series resistance (ESR) of ceramic electronic component 100 may become high.

In a case that a content of the second metal filler is too high, a content of the resin component in the inner external electrode is low, and the inner external electrode may not function as a buffer layer. A shape of the second metal filler is not particularly limited, and it may be spherical or flat, for example. An average particle size of the second metal filler is not particularly limited, and for example, it may be not smaller than about 0.5 µm and not greater than about 5.0 µm.

A weight ratio (a content) of the resin component to a total weight of the first metal filler, the second metal filler, and the resin component in the mixture paste is preferably not lower than about 5 weight % and not higher than about 40 weight % and more preferably not lower than about 9.8 weight % and not higher than about 31.5 weight %, for example.

In a case that a content of the resin component is too low, the inner external electrode may not function as a buffer layer. In a case that a content of the resin component is too high, conductivity of the external electrode is lowered and equivalent series resistance (ESR) of ceramic electronic component 100 may become high.

The inner external electrode is provided by applying the mixture paste to a portion of the surface of laminate 110 with various printing methods or dipping and heating laminate 110 to which the mixture paste has been applied (S111).

In the step of providing an inner external electrode (S111), laminate 110 to which the mixture paste has been applied is preferably heated in a neutral atmosphere such as a nitrogen gas atmosphere or a reducing atmosphere or another non-oxidizing atmosphere. Specifically, laminate 110 to which the mixture paste has been applied is preferably heated in an atmosphere in which a concentration of oxygen is not higher than about 100 ppm, for example.

A temperature for heating laminate 110 to which the mixture paste has been applied is preferably not lower than a temperature at which a crystal state in an alloy of the first metal component and the second metal component thermodynamically changes (a temperature range in which diffusion of the first metal component of the inner external electrode toward the internal electrode is promoted). Specifically, a temperature for heating laminate 110 to which the mixture paste has been applied is preferably not lower than about 450° C., for example. In a case that laminate 110 to which the mixture paste has been applied is heated at such a temperature, an alloy layer of internal electrode 140 and the inner external electrode is formed to extend from an end portion of internal electrode 140 toward the inner external electrode.

In contrast, in a case that a temperature for heating laminate 110 to which the mixture paste has been applied is too high, the inner external electrode cannot be formed in a stable manner. Therefore, a temperature for heating laminate 110 to which the mixture paste has been applied is preferably lower than about 800° C. and more preferably not higher than about 650° C., for example.

In the present preferred embodiment, a temperature for heating laminate 110 to which the mixture paste has been applied and an amount of a metal component contained in the mixture paste are adjusted so as to set an amount of the resin component contained in the inner external electrode to a desired amount. By changing an amount of the inner external electrode itself by adjusting a thickness of the inner external electrode as well, an amount of the resin component contained in the inner external electrode preferably is set to a desired amount.

Then, by barrel-polishing the laminate provided with the inner external electrode, a surface layer of the inner external electrode is barrel-polished (S112). As a result of barrel-polishing, the resin component located in the surface layer of the inner external electrode can be scraped off. Consequently, a concentration of a metal in the surface layer of the inner external electrode is adjusted while the first metal component and the second metal component are exposed at an outer surface of the inner external electrode. Specifically, as a time period for barrel-polishing becomes longer, a concentration of a metal in a surface layer of the inner external electrode becomes higher.

Thereafter, an outer external electrode is provided on the inner external electrode by bonding a metal component with plating or the like (S113). Electrolytic plating is preferred as a method of providing an outer external electrode.

A surface external electrode is further provided on the outer external electrode by bonding a metal component with plating or the like. Electrolytic plating is preferred as a method of providing a surface external electrode.

Through the step of providing an inner external electrode (S111), the barrel-polishing step (S112), and the step of providing an outer external electrode (S113) and providing a surface external electrode, the external electrode is provided on a portion of the surface of laminate 110 so as to electrically be connected to internal electrode 140 (S110).

Ceramic electronic component 100 according to the present preferred embodiment preferably is fabricated through the step of preparing laminate 110 (S100) and the step of providing an external electrode (S110).

A position where an external electrode is provided is not limited to opposing end portions of laminate 110. A variation in which an external electrode is provided at a position other than opposing end portions of laminate 110 will be described below.

Figure 6:
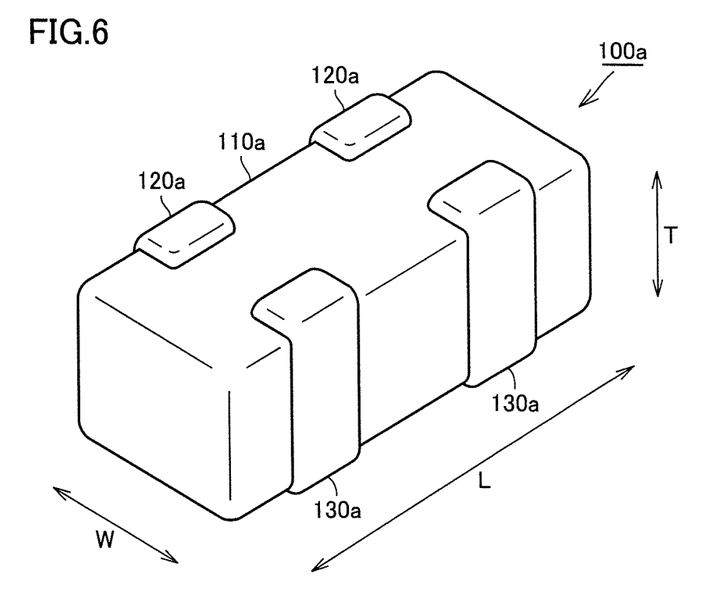
FIG. 6 is a perspective view showing appearance of a ceramic electronic component according to a first variation of a preferred embodiment of the present invention.
Figure 7:
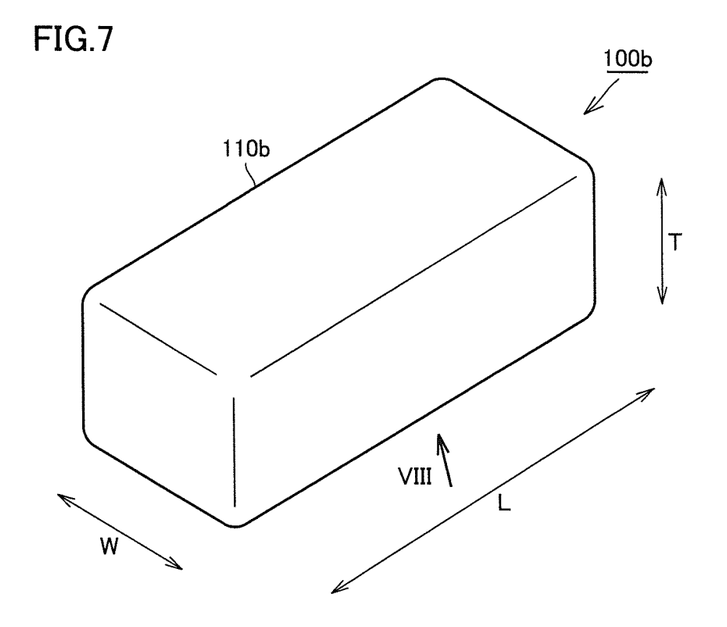
FIG. 7 is a perspective view showing appearance of a ceramic electronic component according to a second variation of a preferred embodiment of the present invention.
Figure 8:
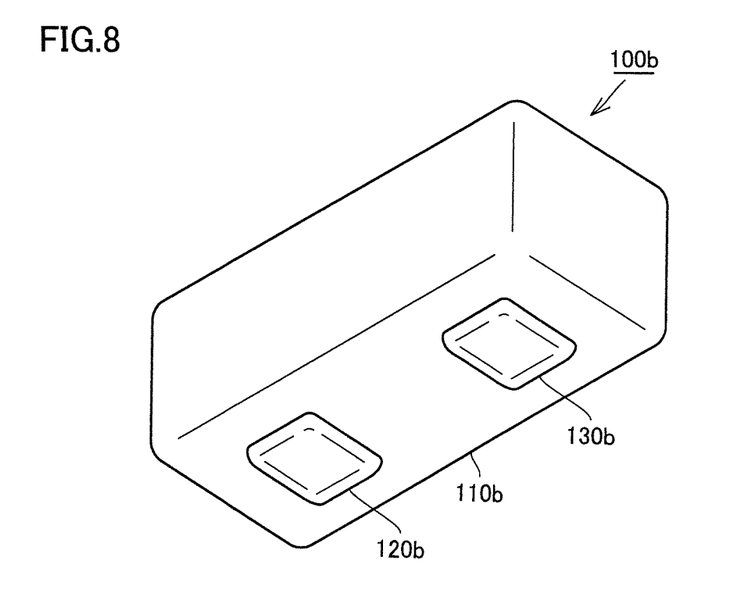
FIG. 8 is a diagram of the ceramic electronic component in FIG. 7 viewed in a direction shown with an arrow VIII.

FIG. 6 is a perspective view showing appearance of a ceramic electronic component in a first variation of a preferred embodiment of the present invention. FIG. 7 is a perspective view showing appearance of a ceramic electronic component in a second variation of a preferred embodiment of the present invention. FIG. 8 is a diagram of the ceramic electronic component in FIG. 7 viewed in a direction shown with an arrow VIII.

As shown in FIG. 6, in a ceramic electronic component 100a in the first variation, a first external electrode 120a is provided to extend from one side surface of a laminate 110a to opposing main surfaces. A second external electrode 130a is provided to extend from one side surface of laminate 110a to opposing main surfaces. Ceramic electronic component 100a in the first variation is what is called a capacitor array.

As shown in FIGS. 7 and 8, in a ceramic electronic component 100b in the second variation, a first external electrode 120b is provided on one end surface side on one main surface of laminate 110a. A second external electrode 130b is provided on the other end surface side on one main surface of laminate 110a. Ceramic electronic component 100b in the second variation is what is called a filletless capacitor.

A non-limiting experimental example in which an effect of the present invention was confirmed will be described below.

Five hundred ceramic electronic components each having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm were fabricated and subjected to an experiment.

Conditions other than a time period for barrel-polishing were common in fabrication of ceramic electronic components. Initially, common conditions and features will be described.

$BaTiO_3$ was used as a material for forming a ceramic layer. An average thickness of each ceramic layer was set to about 1.0 μm. Ni was used as a material forming an internal electrode. An external electrode was provided in each of opposing end portions of the laminate.

A first metal filler was including Sn and a second metal filler was including Ag. An epoxy resin was used as a resin component. A weight ratio between the first metal filler and the second metal filler in a mixture paste was set to about 3:7.

A volume ratio (a content) of the first metal filler and the second metal filler in total in the cured mixture paste was about 46 volume %. A volume ratio (a content) of the resin component in the cured mixture paste was about 54 volume %.

The laminate to which the mixture paste had been applied was heated at about 450° C. in a nitrogen gas atmosphere for about 20 minutes. A volume ratio (a content) of the first metal filler and the second metal filler in total in the cured mixture paste was about 77 volume %. A volume ratio (a content) of the resin component in the cured mixture paste was about 23 volume %.

A thickness of an inner external electrode was not smaller than about 20 μm and not greater than about 30 μm (a target value was a median value in this range). An outer external electrode was formed from a Ni plating film having a thickness not smaller than about 2 μm and not greater than about 3 μm (a target value was a median value in this range). A surface external electrode was formed from a Sn plating film having a thickness not smaller than about 2 μm and not greater than about 3 μm (a target value was a median value in this range).

In Example 1, 100 ceramic electronic components were fabricated, with a time period for barrel-polishing being set to about 60 minutes. In Example 2, 100 ceramic electronic components were fabricated, with a time period for barrel-polishing being set to about 30 minutes. In Example 3, 100 ceramic electronic components were fabricated, with a time period for barrel-polishing being set to about 20 minutes.

In Comparative Example 1, 100 ceramic electronic components were fabricated, with a time period for barrel-polishing being set to 10 minutes. In Comparative Example 2, 100 ceramic electronic components were fabricated, with a time period for barrel-polishing being set to 5 minutes. In Comparative Example 3, 100 ceramic electronic components were fabricated without barrel-polishing.

In 3 of 100 ceramic electronic components fabricated in each of Examples 1 to 3 and Comparative Examples 1 to 3, a concentration of a metal in a surface layer of the inner external electrode located at a boundary between the inner external electrode and the outer external electrode was determined. An incidence of solder burst caused in mounting of 100 ceramic electronic components fabricated in each of Examples 1 to 3 and Comparative Examples 1 to 3 was checked.

A concentration of a metal in a surface layer of the inner external electrode was determined as below. Initially, the outer external electrode and the surface external electrode were removed with a nitric acid aqueous solution or the like. Then, a portion of the outer surface of the inner external electrode located in a central portion of the end surface of the laminate was subjected to X-ray photoelectron spectroscopy (XPS) analysis.

Specifically, an area of about 500 μm long and about 500 μm wide in the outer surface of the inner external electrode was subjected to XPS analysis with the use of Quantum 2000 manufactured by Ulvac-Phi, Incorporated. Monochromated AlKα beams were used as an X-ray source, a beam diameter was set to about 100 μm, and a depth of analysis was set to about 5 nm.

An atomic weight of each of C, O, Si, Ag, Ba, and Sn contained in a surface layer of the inner external electrode was determined using XPS analysis. A concentration of a metal in the surface layer of the inner external electrode was calculated by calculating, based on each atomic weight obtained in this determination, [(atomic weight of Ag+atomic weight of Sn)/(atomic weight of C+atomic weight of Ag+atomic weight of Sn)]×100. A concentration of a metal in the surface layer of the inner external electrode in each of Examples 1 to 3 and Comparative Examples 1 to 3 was defined as a value obtained by averaging results of calculation of concentrations of metals in the surface layer of the inner external electrode in 3 ceramic electronic components subjected to XPS analysis.

An incidence of solder burst was calculated as below. After a ceramic electronic component was mounted in a reflow step to a glass epoxy substrate, a state of release of solder was visually checked. An incidence of solder burst was calculated by dividing the number of ceramic electronic components in which solder burst had been observed by the number of mounted ceramic electronic components (100) and further multiplying the result by 100.

Figure 9:
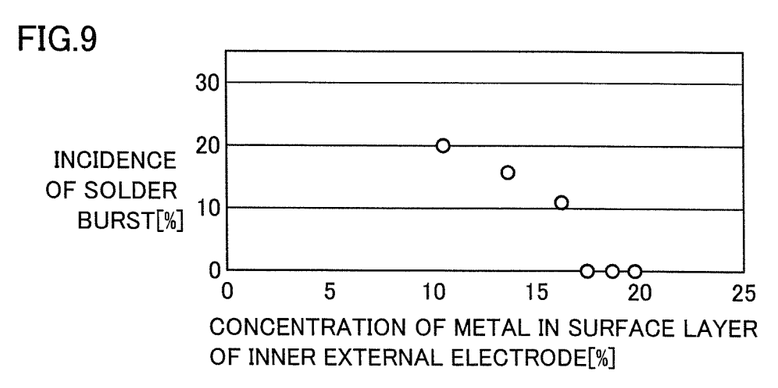
FIG. 9 is a graph showing a relationship between a concentration of a metal in a surface layer and an incidence of solder burst in results of the present experiment.

Table 1 summarizes results of experiments in Examples 1 to 3 and Comparative Examples 1 to 3. FIG. 9 is a graph showing relation between a concentration of a metal in a surface layer and an incidence of solder burst in results of the present experiment. In FIG. 9, the ordinate represents an incidence (%) of solder burst and the abscissa represents a concentration (%) of a metal in a surface layer of the inner external electrode.

TABLE 1

| | Time Period for Barrel-Polishing (minute) | Concentration of Metal in Surface Layer of Inner External Electrode (%) | Incidence of Solder Burst (%) |
|---|---|---|---|
| Example 1 | 60 | 19.7 | 0 |
| Example 2 | 30 | 18.6 | 0 |
| Example 3 | 20 | 17.5 | 0 |
| Comparative Example 1 | 10 | 16.2 | 11 |
| Comparative Example 2 | 5 | 13.8 | 16 |
| Comparative Example 3 | 0 | 10.5 | 20 |

As shown in Table 1 and FIG. 9, in Example 1, a concentration of a metal in a surface layer of the inner external electrode was about 19.7% and an incidence of solder burst was 0%. In Example 2, a concentration of a metal in a surface layer of the inner external electrode was about 18.6% and an incidence of solder burst was 0%. In Example 3, a concentration of a metal in a surface layer of the inner external electrode was about 17.5% and an incidence of solder burst was 0%.

In Comparative Example 1, a concentration of a metal in a surface layer of the inner external electrode was 16.2% and an incidence of solder burst was 11%. In Comparative Example 2, a concentration of a metal in a surface layer of the inner external electrode was 13.8% and an incidence of solder burst was 16%. In Comparative Example 3, a concentration of a metal in a surface layer of the inner external electrode was 10.5% and an incidence of solder burst was 20%.

It was confirmed in the above-described experimental example that a concentration of a metal in a surface layer of the inner external electrode was higher as a time period for barrel-polishing was longer. It was confirmed that an incidence of solder burst lowered as a concentration of a metal in a surface layer of the inner external electrode was higher.

An incidence of solder burst is preferably not higher than about 15%, for example. By setting a concentration of a metal in a surface layer of the inner external electrode to about 17% or higher, an incidence of solder burst could be not higher than about 15%, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component, comprising:
    a rectangular or substantially rectangular parallelepiped laminate in which a ceramic layer and an internal electrode are alternately laminated; and
    an external electrode located on a portion of a surface of the laminate and electrically connected to the internal electrode; wherein
    the external electrode includes an inner external electrode covering a portion of the surface of the laminate and includes a mixture of a resin component and a metal component and an outer external electrode covering the inner external electrode and including a metal component;
    the inner external electrode includes, as a metal component, a first metal component of which a portion forms an alloy with the internal electrode so as to connect the internal electrode and the inner external electrode to each other and a second metal component higher in melting point than the first metal component, of which a portion forms an alloy with the first metal component so as to connect the inner external electrode and the outer external electrode to each other; and
    a concentration of a metal in a surface layer of the inner external electrode is not lower than about 17.5% and not higher than about 19.7%.

2. The ceramic electronic component according to claim 1, wherein the metal component of the outer external electrode is Ni.

3. The ceramic electronic component according to claim 1, wherein the first metal component is Sn.

4. The ceramic electronic component according to claim 1, wherein the second metal component is Ag or Cu.

5. The ceramic electronic component according to claim 1, wherein the ceramic electronic component is one of a piezoelectric component, a thermistor, and an inductor.

6. The ceramic electronic component according to claim 1, wherein the concentration of the metal in the surface layer of the inner external electrode is a ratio of a total of atomic percentage of the first metal component and atomic percentage of the second metal component to a total of an atomic percentage of the first metal component, an atomic percentage of the second metal component, and an atomic percentage of the resin component in the surface layer extending from an outer surface of the inner external electrode to a prescribed depth therein.

7. The ceramic electronic component according to claim 6, wherein the atomic percentage of the resin component is defined as an atomic percentage of C contained in the resin component.

8. The ceramic electronic component according to claim 6, wherein the prescribed depth is about 5 nm from the outer surface of the inner external electrode.

* * * * *